(12) United States Patent
Yang et al.

(10) Patent No.: US 7,532,518 B2
(45) Date of Patent: May 12, 2009

(54) COMPENSATION METHOD TO ACHIEVE UNIFORM PROGRAMMING SPEED OF FLASH MEMORY DEVICES

(75) Inventors: Nian Yang, Mountain View, CA (US); Fan Wan Lai, San Jose, CA (US); Aaron Lee, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 58 days.

(21) Appl. No.: 11/767,622

(22) Filed: Jun. 25, 2007

(65) Prior Publication Data

US 2008/0316830 A1 Dec. 25, 2008

(51) Int. Cl.
*G11C 16/06* (2006.01)
(52) U.S. Cl. .............................. 365/185.23; 365/185.18; 365/185.17
(58) Field of Classification Search ............ 365/185.23, 365/185.18, 185.17
See application file for complete search history.

(56) References Cited

U.S. PATENT DOCUMENTS

2003/0145154 A1  7/2003  Barnett et al.
2005/0254309 A1*  11/2005  Kwon et al. ........... 365/185.28
2007/0133341 A1  6/2007  Lee et al.

OTHER PUBLICATIONS

International Search Report for PCT/US2008/63188 dated Aug. 22, 2008.
Written Opinion for PCT/US2008/63188 dated Aug. 22, 2008.

* cited by examiner

*Primary Examiner*—Huan Hoang
(74) *Attorney, Agent, or Firm*—Turocy & Calvin, LLP

(57) ABSTRACT

Systems and methodologies are provided herein for increasing operation speed uniformity in a flash memory device. Due to the characteristics of a typical flash memory array, memory cells in a memory array may experience distributed substrate resistance that increases as the distance of the memory cell from an edge of the memory array increases. This difference in distributed substrate resistance can vary voltages supplied to different memory cells in the memory array depending on their location, which can in turn cause non-uniformity in the speed of high voltage operations on the memory array such as programming. The systems and methodologies provided herein reduce this non-uniformity in operation speed by providing compensated voltage levels to memory cells in a memory array based at least in part on the location of each respective memory cell. For example, a compensated operation voltage can be provided that is higher near the center of the memory array and lower near an edge of the memory array, thereby lessening the effect of distributed substrate resistance and providing increased operation speed uniformity throughout the memory array.

20 Claims, 12 Drawing Sheets

COMPENSATION METHOD TO ACHIEVE UNIFORM PROGRAMMING SPEED OF FLASH MEMORY DEVICES

TECHNICAL FIELD

The following description relates generally to memory systems and more particularly to programming flash memory devices.

BACKGROUND

Electronic devices with the ability to store information (electronic devices) are an important part of society. Electronic devices influence almost every aspect of life, ranging from business transactions to interpersonal communications. Examples of electronic devices include cellular telephones, personal digital assistants, and personal computers. One important aspect of electronic devices is the ability to store information in digital memory. Digital memory can be provided, for example, by a flash memory device. Flash memory has the advantages of being readable, rewritable, and non-volatile (i.e., flash memory can retain information without a draw from a constant source of power). Additionally, flash memory is relatively inexpensive to mass-produce, making it a desirable choice for personal applications such as storing digital photographs and storing digital music files. Moreover, flash memory devices generally have an expected lifespan of about one million programming cycles.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

Conventional flash memory devices store information in memory cells that are connected to each other via bitlines and wordlines to form a memory array. Each memory cell in a memory array is capable of storing one or more bits of information. A memory cell can be programmed or erased by supplying appropriate programming or erase voltage levels, respectively, to a wordline and bitline in the memory array that is connected to the cell to be programmed or erased. However, depending on the position of the wordline in the memory array containing the memory cell, the voltage levels actually received at the memory cell can vary due to distributed resistance of the memory array. These voltage variations cause the programming and erase speeds between memory cells on different wordlines within the memory array to be inconsistent, which in turn can lead to a decrease in the reliability and overall performance of the flash memory device.

The disclosed innovation provides systems and methodologies for compensated programming of the memory cells in a memory array in order to achieve a more consistent programming speed throughout the memory array. In accordance with one aspect of the innovation, a flash memory device having a memory array utilizes a programming compensation technique to provide different programming voltage levels to various memory cells in the memory array. These programming voltage levels are provided to a memory cell in the memory array based at least in part on the location of the wordline within the memory array that contains the memory cell.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

BRIEF DESCRIPTION OF THE DRAWINGS AND APPENDICES

DETAILED DESCRIPTION

Figure 1:
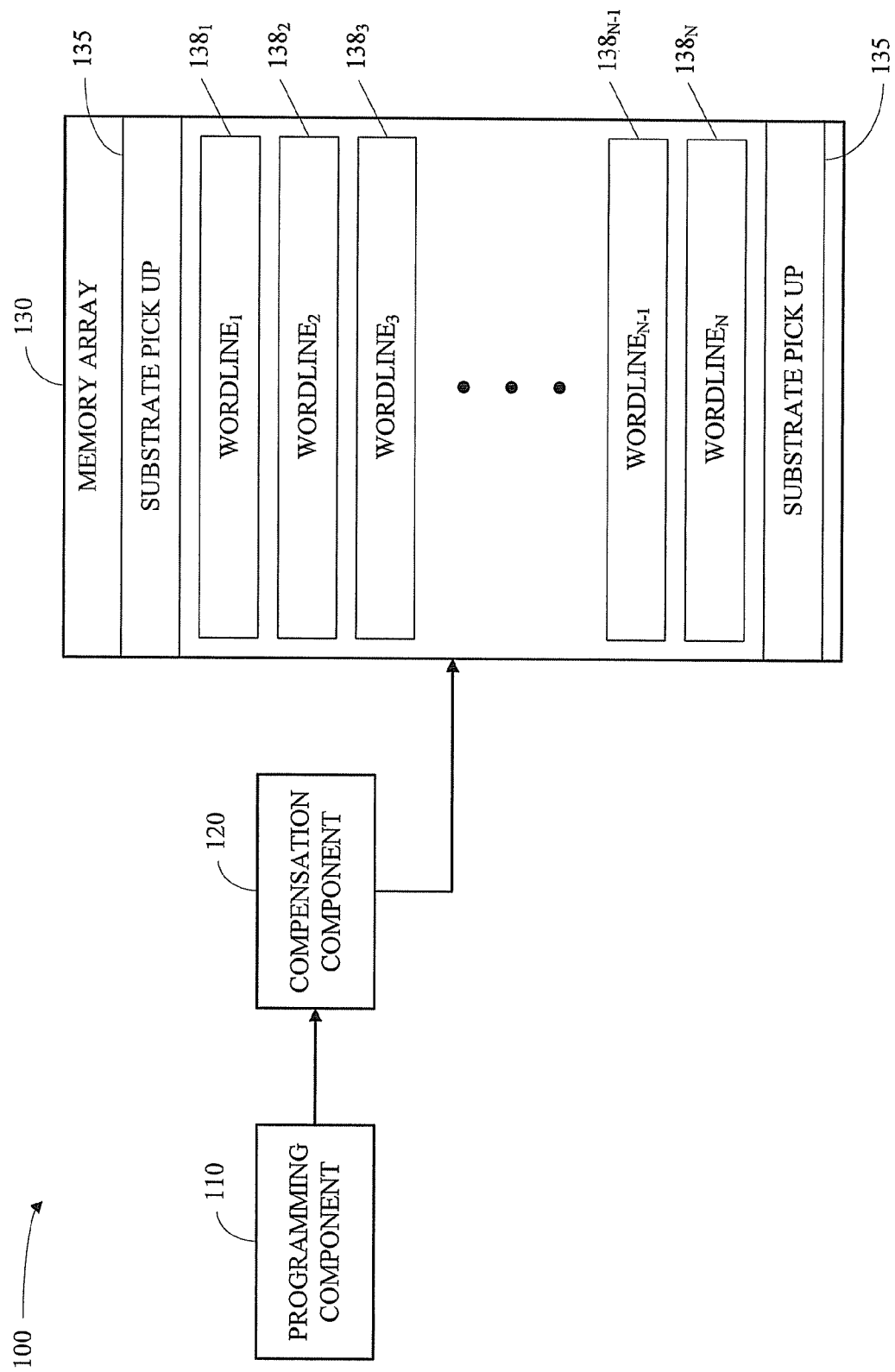
FIG. 1 illustrates a block diagram of a partial flash memory device including programming compensation in accordance with one aspect of the specification.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Referring now to the drawings, FIG. 1 is a block diagram of a partial flash memory device 100 including programming compensation in accordance with one aspect of the specification. The flash memory device 100 includes a memory array 130, which stores data in cells (not shown) located along wordlines 138. Cells electrically coupled to the wordlines 138 are programmed by trapping a charge within the cells. To erase the cells, this charge is then released by applying a negative high voltage to the wordlines 138 and a positive high voltage to the individual cells in a wordline 138.

When a charge is released from a cell, the charge flows as erase current to one of two grounded substrate pick ups 135 that are located at opposing edges of the memory array 130. However, the memory array 130 can have a distributed substrate resistance, which will cause the properties of each wordline 138 to vary depending on the distance from the wordline 138 to a substrate pick up 135. Specifically, erase current from cells coupled to wordlines 138 located away from a substrate pick up 135, such as wordlines 138 located at or about the center of the memory array 130, have to flow farther than erase current from cells coupled to wordlines 138 located at an edge of the memory array 130 that are close to a substrate pick up 135. Thus, erase current from cells coupled to wordlines 138 located farther away from a substrate pick up 135 experience greater distributed substrate resistance due to the increased distance. This, in turn, causes the wordlines 138 located farther away from a substrate pick up 135 to experience a voltage drop from the wordline to the substrate pick up due to this greater distributed substrate resistance. This voltage drop, also referred to as an internal resistance or IR drop, effectively changes the amount of voltage provided to the wordlines 138 in the memory array by changing the relative ground of the wordlines 138 based on their location in the memory array 135.

Because the IR drop causes the voltage provided to the wordlines 138 in the memory array 130 to vary according to the position of the wordline 138 in the memory array 130, cells associated with wordlines 138 near the center of the memory array 130 may be erased more slowly than cells associated with wordlines 138 near the edges of the memory array 130. Thus, a charge programmed onto a cell associated with a wordline 138 near the center of the memory array 130 may not be completely released from the cell during an erase due to the slower erase speed of the cell. Further, the cells coupled to the memory array 130 can often pass erase verification after an erase even when the threshold voltages of the cells differ as a result of the non-uniformity in erase speed from one wordline 138 to another.

The non-uniformity in erase speed and threshold voltage based on the location of a wordline 138 in the memory array 130 can have the opposite effect on a subsequent programming of the cells in the wordline 138. More particularly, re-programming of the cells associated with a wordline 138 near the center of the memory array 130 may be faster because part of the charge from a previous programming operation may not be completely released during the erase. Conversely, re-programming of the cells associated with a wordline 138 near an edge of the memory array 130 may be slower because more of the charge from a previous programming operation may be released during the erase. Because of this non-uniformity of programming speed among the wordlines 138 associated with the memory array 130, quickly-programmable cells near the middle of the memory array 130 may become over-programmed and over-stressed while more slowly-programmable cells near the edges of the memory array 130 finish programming. This, in turn, cam lead to a decrease in the long-term reliability and performance of the flash memory device 100.

To mitigate the above problems, one aspect of the specification provides for compensated memory operations based on characteristics of memory cells located in a memory array 130. While the exemplary embodiments disclosed in the specification relate generally to compensating programming speed, one of ordinary skill in the art can appreciate that the embodiments disclosed herein are applicable to any high-voltage or high-current operation within a flash memory cell and/or array.

In accordance with one aspect of the specification, a flash memory device 100 includes a memory array 130 as described above and a programming component 110 that initiates a programming operation on specified cells in the memory array 130 by specifying voltages to be applied to various wordlines 138 and cells in the memory array 130. The device 100 can further include a compensation component 120, which receives a programming operation initiated by the programming component 110 and modifies the programming operation to provide enhanced programming speed uniformity among the wordlines 138 of the memory array 130. In one example, the compensation component 120 can vary the voltages that are applied to the wordlines 138 in the memory array 130 during a programming operation based on the position of each wordline 138 in the memory array 130.

As a further example, when a programming operation is initiated by the programming component 110 for a cell located near the center of the memory array 130 (e.g., where erase operations are known to be slower), a compensated programming voltage that is lower than an average programming voltage can be applied by the compensation component 120 to the cell to be programmed, its corresponding wordline 138, or both. Further, the programming voltage provided by the compensation component 120 can be compensated based on the position of the wordline 138 in the memory array 130 that contains the cell to be programmed. Thus, programming speed for one or more wordlines 138 can be made slower by lowering the programming voltage for the wordline 138 based on its position in the memory array 130, thereby leading to a uniform programming speed among the wordlines 138 that is comparable to the uncompensated programming speed of wordlines 138 near the edges of the memory array 130.

Alternatively, a higher programming voltage can be provided by the compensation component 120 to a cell located near an edge of the memory array 130 (e.g., where erase operations are known to be faster) upon the initiation of a programming operation for the cell. In addition, this higher programming voltage can also be varied depending on the position of a wordline 138 within the memory array 130 containing the cell to be programmed. By increasing the programming voltage for a particular cell, the programming speed of the cell can be increased, thereby leading to a uniform programming speed among the wordlines 138 that is comparable to the uncompensated programming speed of wordlines 138 near the center of the memory array 130. As another alternative, the compensation component 120 can utilize a combination of higher and lower programming voltages as discussed above to provide a uniform programming speed that is faster than the uncompensated programming speed of cells near the center of the memory array 130 but slower than the uncompensated programming speed of cells near the edges of the memory array 130.

In this manner, the compensation component 120 can provide enhanced uniformity to an operation within a flash memory device 100 by compensating said operation based on the location of one or more wordlines 138 within a memory array 130. By doing so, the compensation component 120 can provide increased and more cost-effective operation uniformity in a flash memory device 100 than that provided by traditionally suggested or implemented solutions. For example, one traditional solution requires the placement of a third substrate pick up at the center of the memory array. This lowers the distance that erase current must flow from a wordline to a substrate pick up in the memory array, thereby lessening the IR effect of the memory array. However, such a traditional solution in effect merely creates two memory arrays, each of which are subject to the same non-uniformity problems as discussed above. Further, adding a second memory array to a device unnecessarily increases the complexity, size, and cost of the device. In contrast, the embodiments disclosed herein can provide enhanced uniform operation speed among the wordlines of a memory array of any size without sacrificing device size or cost.

Referring to FIGS. 2-6, schematic diagrams of a typical flash memory cell and/or a typical flash memory array are illustrated to provide additional context for the claimed subject matter and to illustrate the operation of various embodiments disclosed herein. For the avoidance of doubt, these schematic diagrams are provided by way of example and not limitation. Accordingly, it is to be appreciated that the embodiments disclosed herein can be utilized with any suitable flash memory cell having any suitable architecture. In addition, the embodiments illustrated herein are not necessarily to be construed as preferred or advantageous over other aspects or designs, nor are they meant to preclude equivalent structures and techniques known to those of ordinary skill in the art. Furthermore, it is to be appreciated that the schematic diagrams are not drawn to scale from one diagram to another nor inside a given diagram, and in particular that the size of the components within each schematic diagram are arbitrarily drawn for facilitating the reading of the diagrams. For example, the techniques described herein can be applied to a single-level memory cells, multi-level memory cells, single bit memory cells (such as dual poly cells), dual bit memory cells (such as mirror bit cells and SONOS cells), quad bit memory cells, and the like. The dual bit memory is a relatively modern memory technology and allows multiple bits to be stored in a single memory cell. The dual bit memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing and storage of two bits.

Figure 2:
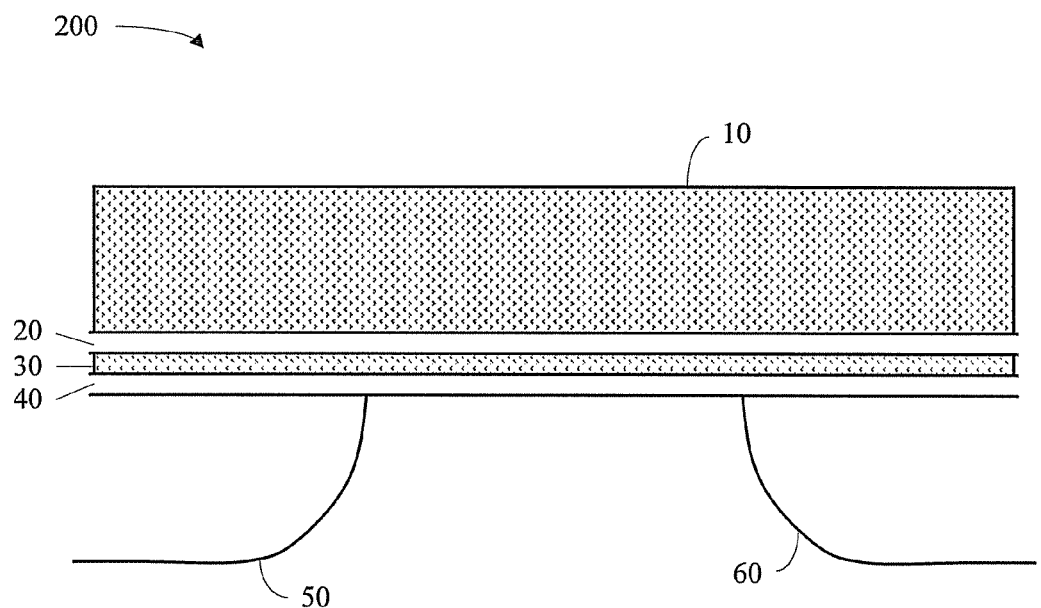
FIG. 2 illustrates a schematic diagram of a standard memory cell typically found in a flash memory device.

FIG. 2 is a schematic diagram illustrating an exemplary memory cell 200 that can employ one or more aspects of the specification. The memory cell 200 can be substantially composed of a floating gate transistor having a source region 50, a drain region 60, and a floating gate implemented as an oxide-nitride-oxide (ONO) stack having a nitride layer 30 enclosed in two oxide layers 20 and 40. Further, the memory cell 200 can be connected to other memory cells via a wordline 10. The wordline 10 can be composed of polysilicon (poly) or any other appropriate conductive material. In one example, the memory cell 200 stores one or more bits of data by trapping and/or releasing a charge in the nitride layer 30 of the ONO stack. Additionally, the nitride layer 30 can be formed from a non-conductive material, thereby allowing the nitride layer 30 to trap a charge such that it cannot move freely within the nitride layer 30.

Figure 3A:
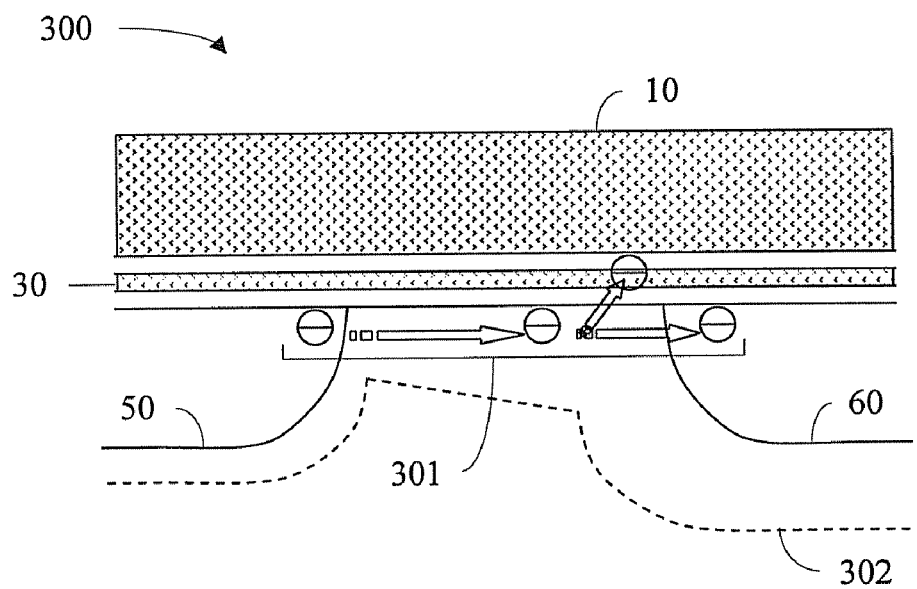
FIG. 3A illustrates a schematic diagram of a programming operation performed on a standard flash memory cell.
Figure 3B:
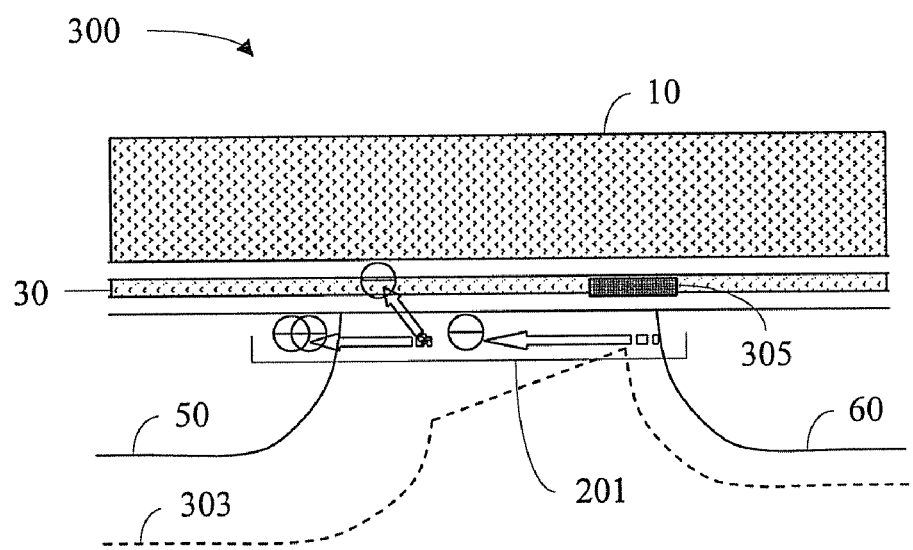
FIG. 3B illustrates a schematic diagram of a programming operation performed on a standard flash memory cell.

FIGS. 3A and 3B are schematic diagrams illustrating exemplary programming operations performed on a flash memory cell 300 that can employ one or more aspects of the specification. In particular, FIGS. 3A and 3B illustrate the use of channel hot electron injection to program two bits contained within memory cell 300. It should be appreciated that the particular programming operation and memory cell architecture illustrated by FIGS. 3A and 3B are only one of many possible high-voltage and/or high-current operations and memory cell architectures that can utilize the embodiments disclosed herein and that all such operations and architectures are intended to fall within the scope of the hereto appended claims.

Referring now specifically to FIG. 3A, a programming operation performed on a first bit of a memory cell 300 is illustrated. To program the first bit of memory cell 300, the wordline 10 and the drain 60 of the memory cell 300 are set to high voltages while the source 50 is set to ground. By way of a non-limiting example, the voltage across the wordline 10 can be about 9 volts and the voltage across the drain 60 can be about 4 volts. As a result of the high voltages across the wordline 10 and drain 60, electrons 301 can be drawn to the ONO stack of the memory cell 300. The dotted line 302 illustrates one possible path through which electrons 301 may move as they pass from the source 50 to the drain 60 of the memory cell 300 based on the voltages applied to the memory cell 300. It should be appreciated that other electron paths are possible and that the exact path through which the electrons 301 move can depend on the profile of the source and drain junctions, the combination of the voltage across the wordline 10 and the drain 60, and other appropriate factors. As electrons 301 move across the memory cell 300 and approach the drain 60, the high voltages applied to the wordline 10 and the drain 60 can cause one or more electrons 301 to enter the nitride layer 30 of the ONO stack near the drain 60. In one example, the nitride layer 30 is not conductive. Thus, a charge provided by electrons 301 that enter the nitride layer 30 can become trapped in the nitride layer 30. The presence or absence of a trapped charge in the nitride layer 30 of the memory cell 300 near the drain 60 can then correspond to a first bit of data stored by the memory cell 300, which can be read by determining the existence of a trapped charge in the nitride layer 30 at that location.

Next, FIG. 3B illustrates a programming operation performed on a second bit of memory cell 300. After programming the first bit 305, a second bit can be programmed by reversing the source 50 and the drain 60 of the memory cell 300. Specifically, the wordline 10 and the source 50 of memory cell 300 can be set to high voltages and the drain 60 can be set to ground. Similar to the programming operation illustrated in FIG. 2A, the voltage across the wordline 10 can be about 9 volts and the voltage across the source 50 can be about 4 volts. As a result of the voltages applied to the memory cell 300, electrons 301 can be made to flow from the drain 60 to the source 50 and toward the ONO stack of the memory cell 300. Dotted line 303 illustrates one possible path through which the electrons 301 may move through the memory cell 300 during the programming of a second bit. It should again be appreciated that other electron paths are possible and that the exact path through which the electrons 301 will move can depend on the profile of the source and drain junctions, the combination of the voltage across the wordline 10 and the source 50, and other appropriate factors. Similar to the programming operation illustrated in FIG. 3A, the voltages across the wordline 10 and the source 50 can cause one or more electrons 301 to enter the nitride layer 30 of the ONO stack of the memory cell 300 near the source 50. A charge provided by the electrons that enter the nitride layer 30 may then become trapped in the nitride layer 30, thereby enabling the memory cell 300 to store a second bit of data.

Figure 4:
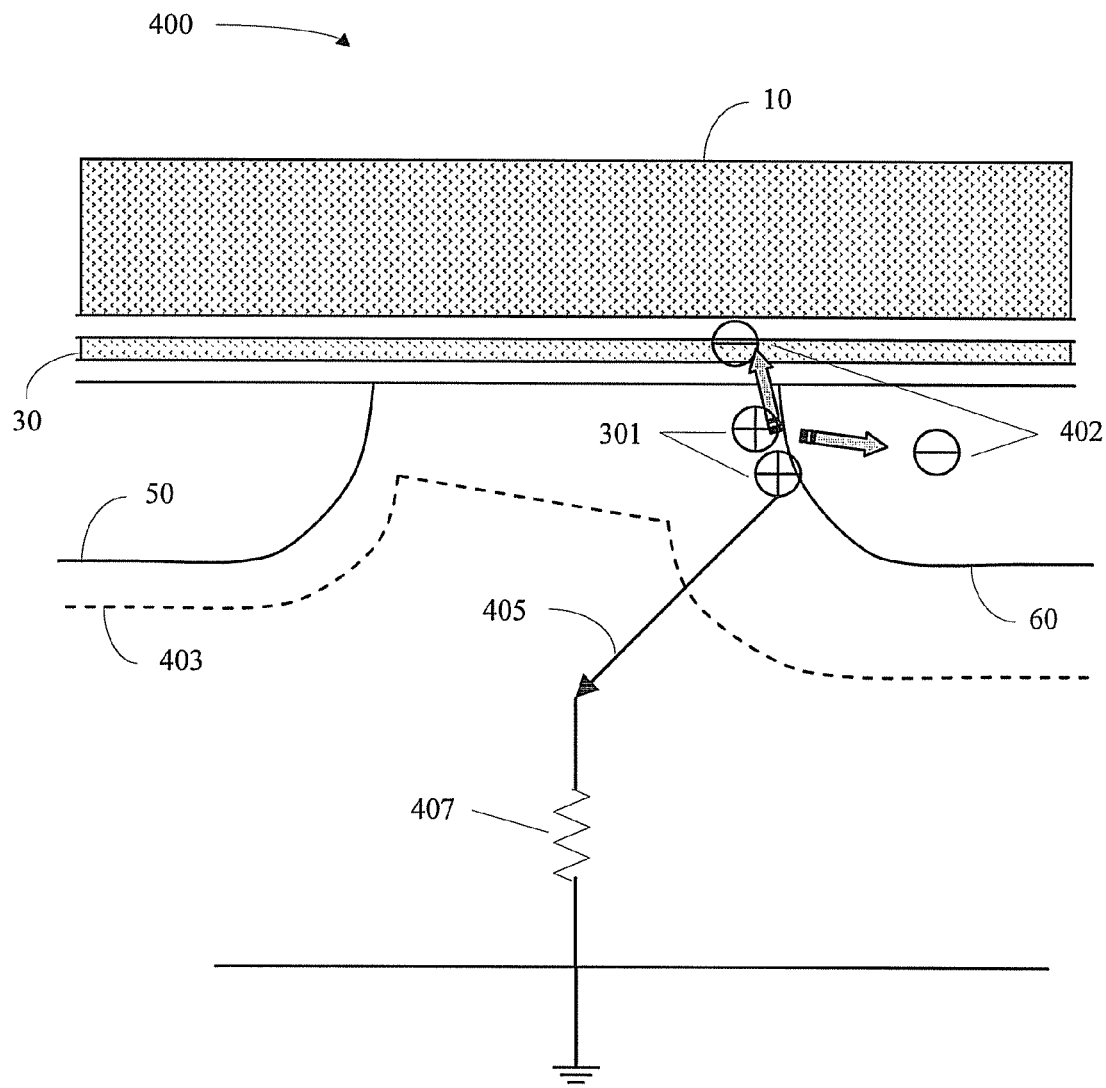
FIG. 4 illustrates a schematic diagram of an erase performed on a standard flash memory cell.

FIG. 4 is a schematic diagram illustrating an erase operation performed on a flash memory cell 400 that can employ one or more aspects of the specification. More particularly, FIG. 4 illustrates the erasure of a flash memory cell 400 via band-to-band hot hole injection. It should be appreciated that the particular erase operation illustrated is only one of many possible high-voltage and/or high-current operations that can utilize the embodiments disclosed herein.

In one example, a first bit of the memory cell 400 is erased by neutralizing a charge that has been trapped in the nitride layer 30 of the memory cell 400 by one or more electrons 402 during a previous programming operation. To neutralize the electrons 402, holes 401 can be injected into the nitride layer 30 by applying a negative high voltage to the wordline 10 and a positive high voltage of substantially equal magnitude to the drain 60 while allowing the source 50 to float. As an additional, non-limiting example, the voltage across the wordline 10 can be about −6 volts and the voltage across the drain 60 can be about 6 volts. As a result of the voltages applied to the memory cell 400, the holes 401 can be made to flow through the memory cell 400 in a path such as the path illustrated by dotted line 403. Further, the holes 401 can be made to enter the nitride layer 30 of the memory cell 400 near the drain 60, thereby releasing a charge provided by electrons 402 in the nitride layer 30. This charge can then flow out of the nitride layer 30 of the memory cell 400 as erase current 405. The erase current 405 may experience distributed substrate resistance as it flows from the memory cell 400, which is represented by resistor 407. After the first bit of the memory cell 400 is erased, a second bit of the memory cell 400 can then be erased in a similar manner by reversing the source 50 and the drain 60. For the sake of brevity, this operation is not illustrated in FIG. 4.

Figure 5:
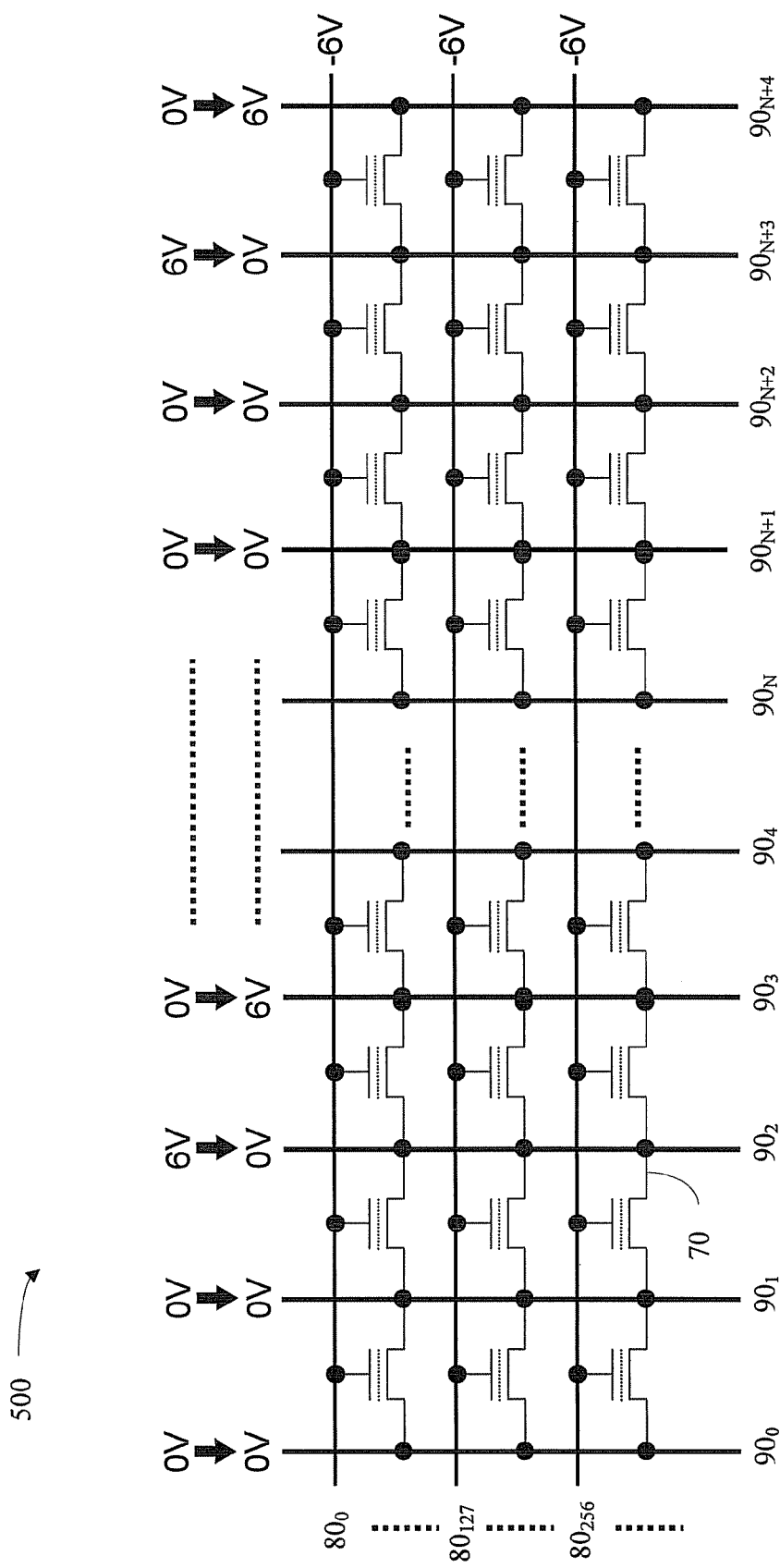
FIG. 5 illustrates a schematic diagram of an erase performed on a standard memory array typically found in a flash memory device.

FIG. 5 is a schematic diagram illustrating an erase operation performed on an exemplary array 500 of flash memory cells 70. In one example, memory cells 70 in the array 500 are connected by wordlines 80 and bitlines 90. Further, the bitlines 90 can be connected to the source and drain regions of each memory cell 70. To initialize an erase operation on the array 500, the wordlines 80 can be set to a negative high voltage. In the non-limiting example illustrated by FIG. 5, this voltage can be about −6 volts. Once the wordlines 80 are initialized, the bitlines 90 can be sequentially switched from ground to a positive high voltage. In the non-limiting example illustrated by FIG. 5, the bitlines 90 can be switched from ground to about 6 volts. Because the bitlines 90 in the exemplary array 500 are connected to the source and drain regions of each memory cell 70 in the array 500, sequentially switching the bitlines 90 from ground to a positive high voltage can erase the memory cells 70 in the array 500 one column at a time in a substantially similar manner to the erase operation illustrated in FIG. 4. In the non-limiting example of array 500, the memory cell labeled as 70 can be erased when bitline $90_2$ is set high.

Figure 6:
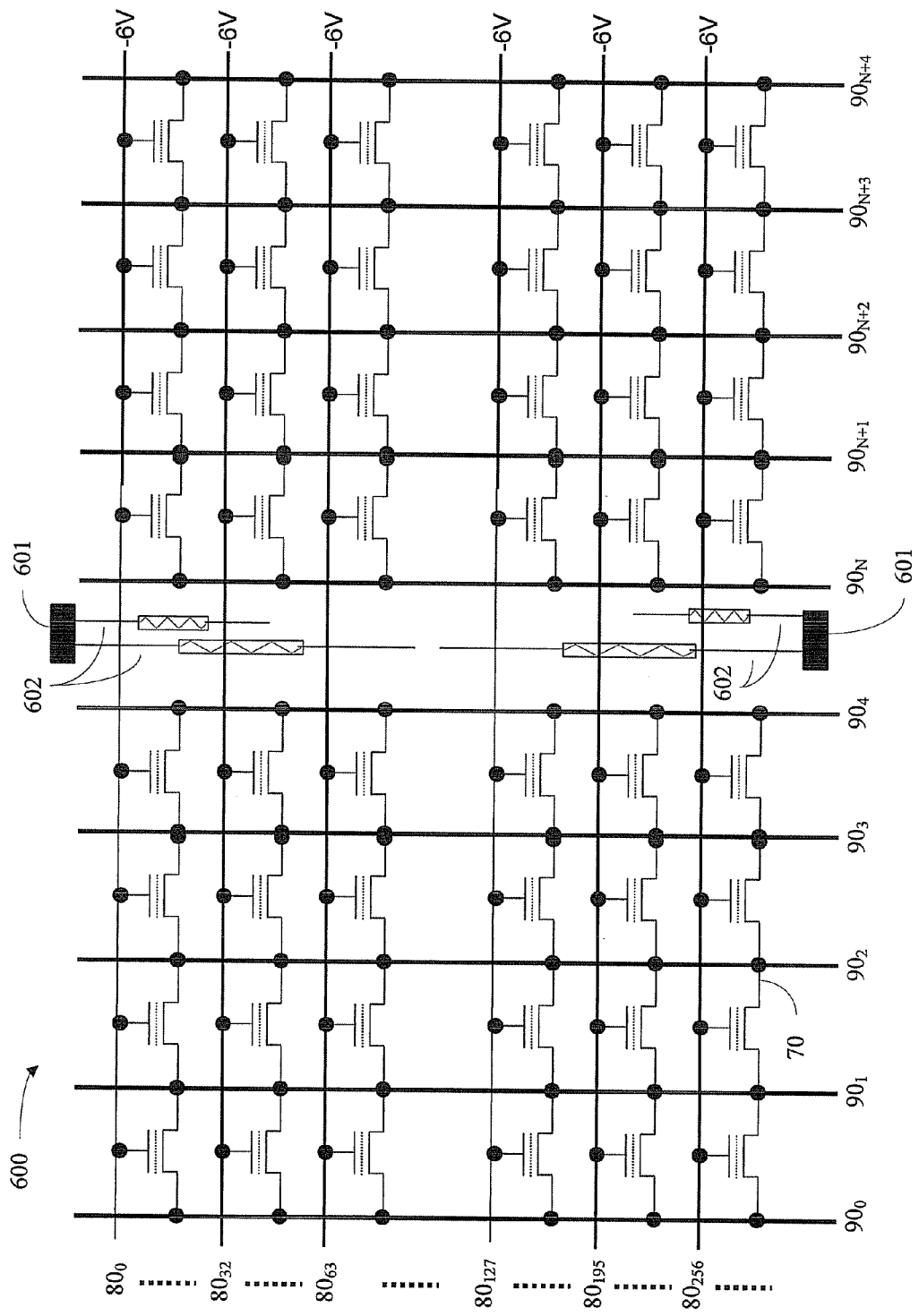
FIG. 6 illustrates a schematic diagram showing the effects of distributed substrate resistance in a standard memory array.

FIG. 6 is a schematic diagram illustrating the effects of distributed substrate resistance in an exemplary array 600 of memory cells 70 during a high-voltage and/or high-current operation on the memory cells 70 of the array 600, such as the erase operation illustrated in FIG. 4 and FIG. 5. In one example, an erase operation can be performed on the memory cells 70 in the array 600 by adjusting the voltage across the wordlines 80 and bitlines 90 in a similar manner to the erase operation illustrated in FIG. 5. During this erase operation, erase current can flow from the memory cells 70 to a grounded substrate pick up 601. The erase current will experience distributed substrate resistance as it flows through the array 600, which is represented by resistors 602. Because erase current from memory cells 70 near the center of the array 600 must flow farther than erase current from memory cells 70 located near the edge of the array 600 to reach a substrate pick up 601, the distributed substrate resistance experienced by a memory cell 70 in the array 600 may increase as the distance of the memory cell 70 to a substrate pick up 601 increases. This increase in distributed substrate resistance is represented by larger resistors 602 that correspond to the rows of the array 600 that are near the center of the array 600. It should be appreciated that while the substrate pick ups 601 are illustrated as being located in the center of the top and bottom edges of array 600, the substrate pick ups 601 can extend along the entire top and bottom edges of the array 600. Thus, each memory cell 70 in a row of the array 600 can experience a substantially similar level of distributed substrate resistance.

Due to the distributed substrate resistance through which erase current from a memory cell 70 in the array 600 must flow during an erase operation, a memory cell 70 in the array 600 may experience a loss of voltage (e.g., an internal resistance or IR drop) from the high voltages supplied by the wordlines 80 and bitlines 90 connected to the memory cell 70. Furthermore, as the distance of a memory cell 70 from a substrate pick up 601 increases, the increase in the distributed substrate resistance on the memory cell 70 may also cause the IR drop experienced by the memory cell 70 to increase. For example, a memory cell 70 located at the top edge of the array 600 connected to wordline $80_0$ may experience very little distributed substrate resistance, and consequently may experience only a negligible IR drop, because it is located very close to a substrate pick up 601. On the other hand, a memory cell 70 located near the center of the array 600 on wordline $80_{127}$ may experience a much greater amount of distributed substrate resistance, and consequently a much higher IR drop, because it is located farther away from a substrate pick up 601. The IR drop experienced by a memory cell 70 located near the center of the array 600 effectively lowers the voltages provided to the memory cell 70 during an erase operation. Thus, because a memory cell 70 near the center of the array 600 receives lower voltages during an erase, it will erase more slowly (and, consequently, program more quickly) than a memory cell 70 near an edge of the array 600.

Figure 7:
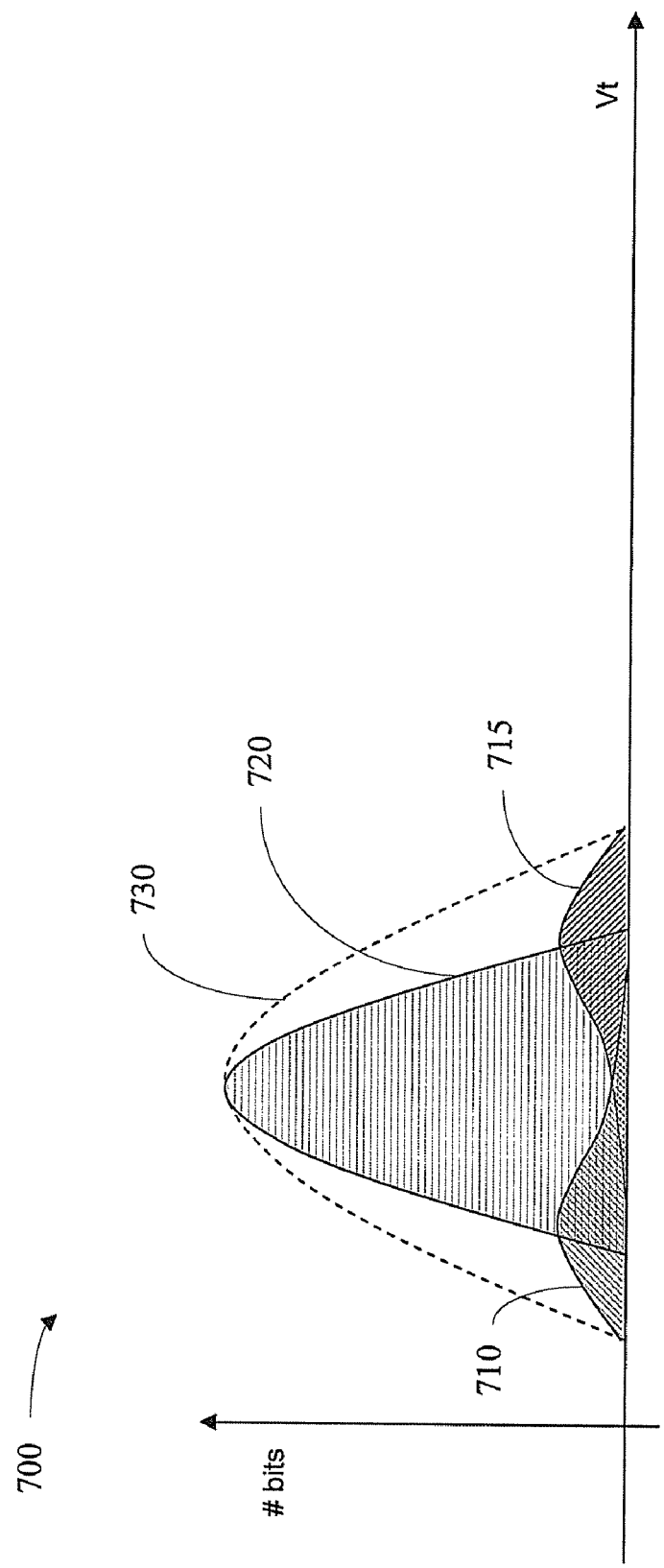
FIG. 7 illustrates a threshold voltage distribution between bits stored in an exemplary flash memory array.

FIG. 7 is a graph 700 illustrating the threshold voltage distribution between bits stored in an exemplary flash memory array. The area under curves 710, 715, and 720 correspond to threshold voltage distributions observed for bits stored by cells at different locations in an exemplary flash memory array. Each of the curves 710, 715, and 720 are bell shaped due to the fact that electrons trapped in a standard flash memory cell are not held entirely stationary, which results in nominal fluctuations to the threshold voltage of a cell at a particular location within an array. The area under curve 710 illustrates the threshold voltage distribution of bits stored by cells located near an edge of a flash memory array. Curve 710 illustrates that bits stored by these cells typically have low threshold voltages, which corresponds to slower programming speeds and a low IR drop during high-voltage operations. In contrast, the area under curve 715 illustrates the threshold voltage distribution of bits stored by cells located near the center of a flash memory array. Curve 715 illustrates that the bits stored by these cells typically have high threshold voltages, which corresponds to faster programming speeds and a high IR drop during high-voltage operations. Finally, the area under curve 720 illustrates the threshold voltage distribution of bits stored by cells that are located near neither the center nor an edge of a flash memory array. As shown by curve 720, the bits stored by these cells have threshold voltages, and consequently programming speeds and an IR drop, between those of bits stored by edge cells and bits stored by center cells. Dashed curve 730 illustrates the total threshold voltage distribution among all bits of a flash memory array. Using one or more embodiments disclosed herein, it is possible to perform operations on a memory cell independent of the location of the cell within a memory array. Thus, the actual performance of a system utilizing one or more of the embodiments disclosed herein can more closely reflect dashed curve 730.

Figure 8:
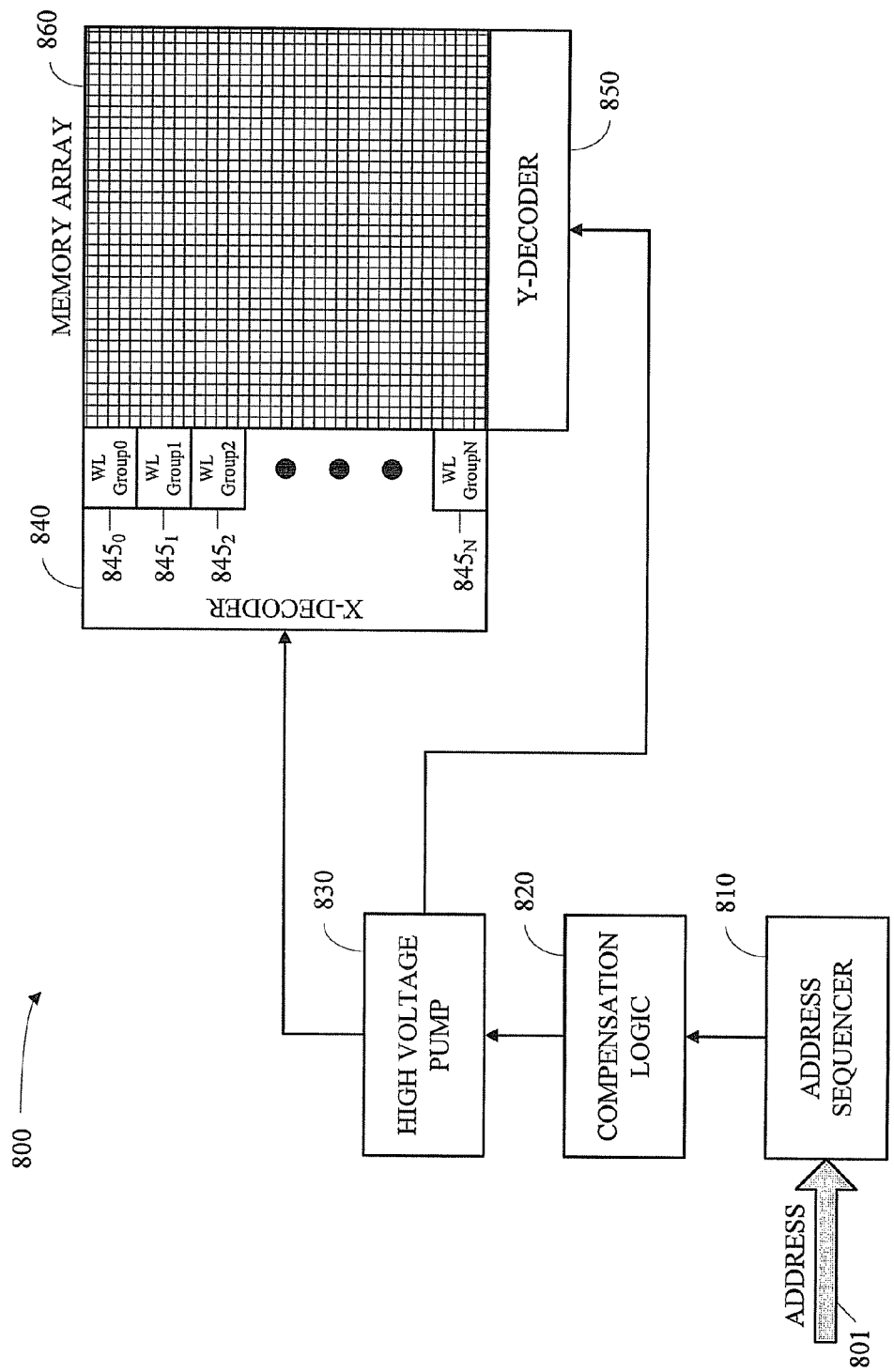
FIG. 8 illustrates a block diagram of an exemplary flash memory device utilizing programming compensation in accordance with one aspect of the specification.

FIG. 8 is a block diagram illustrating an exemplary flash memory device 800 utilizing programming compensation in accordance with one aspect of the specification. It should be appreciated that the flash memory device 800 is only one of many possible flash memory devices that may employ the embodiments disclosed herein, and that other flash memory devices, including those that have one or more features not illustrated or that lack one or more illustrated features, are also possible. In accordance with one aspect, the flash memory device 800 has a memory array 860. Although not shown in FIG. 8 for brevity, the memory array 860 can contain memory cells that can be connected by wordlines and bitlines in a similar manner to flash memory arrays 500 and 600. Further, one or more adjacent wordlines in the memory array 860 can be grouped into wordline groups 845. In one example, a user can initiate a programming operation on the memory array 860 in the flash memory device 800 by providing one or more addresses 801 to an address sequencer 810 that correspond to one or more cells to be programmed within the memory array 860. For each given address 801, the address sequencer 810 can determine the wordline group 845 in the memory array 860 that contains the cell that is referenced by the address 801.

To program the addressed cells in the memory array 860, a high voltage pump 830 can then be used to generate the respective high voltages for the wordline and bitline that are connected to each cell in the memory array 860 to be programmed. Once the high voltage pump 830 generates these voltages, it can transfer the wordline high voltage to the x-decoder 840 and the bitline high voltage to the y-decoder 850. In turn, the x-decoder 840 and y-decoder 850 can provide these respective high voltages to the proper wordline and bitline in the memory array 860 for programming. In a conventional flash memory programming operation, the wordline and bitline high voltages are constant regardless of the location of a cell within the memory array to be programmed. In contrast, one aspect of the present specification provides compensation logic 820 that can control the high voltage pump 830 by adjusting the wordline and bitline high voltages generated by the high voltage pump 830 based on the location of the wordline group 845 within the memory array 860 that contains the cell to be programmed. As a specific, non-limiting example, the compensation logic 820 can adjust the wordline voltage generated by the high voltage pump 830 downward if a cell to be programmed is located in a wordline group 845 near the center of the memory array 860. Thus, the compensation logic 820 can facilitate slower programming of a cell near the center of the memory array 860. Additionally and/or alternatively, the compensation logic 820 can adjust the wordline voltage generated by the high voltage pump 830 upward if a cell to be programmed is located in a wordline group 845 near an edge of the memory array 860. Thus, the compensation logic 820 can facilitate faster programming of a cell near an edge of the memory array 860.

In another specific, non-limiting example, the flash memory device 800 can receive a plurality of addresses 801 corresponding to a plurality of cells within the memory array 860 to be programmed. The address sequencer 810 can receive these addresses 801 and sort them based on their position in the memory array 860. For example, the address sequencer 810 can sort the addresses 801 in ascending order based primarily on wordline location and secondarily on bitline location. Once the address sequencer 810 sorts the addresses 801, the address sequencer 810 can determine the wordline group 845 that contains each cell that is referenced by the addresses 801. The address sequencer 810 can then transfer the addresses 801 and corresponding wordline group information one address at a time to the compensation logic 820. The compensation logic 820 can then adjust the high voltages according to the location of each cell, which are then in turn generated by the high voltage pump 830 and transferred to the x-decoder 840 and y-decoder 850. Because the addresses are sorted by the address sequencer 810, the x-decoder 840 can hold the high wordline voltage generated by the high voltage pump 830 in place while the y-decoder 850 switches the high bitline voltage generated by the high voltage pump 830 across all bitlines in the memory array 860 that are connected to cells to be programmed. To hold the high wordline voltage steady during bitline switching and to improve the stability of the flash memory device 800, the high voltage pump 830 can utilize a local boosting scheme to maintain a wordline voltage level during programming cycles.

Figure 9:
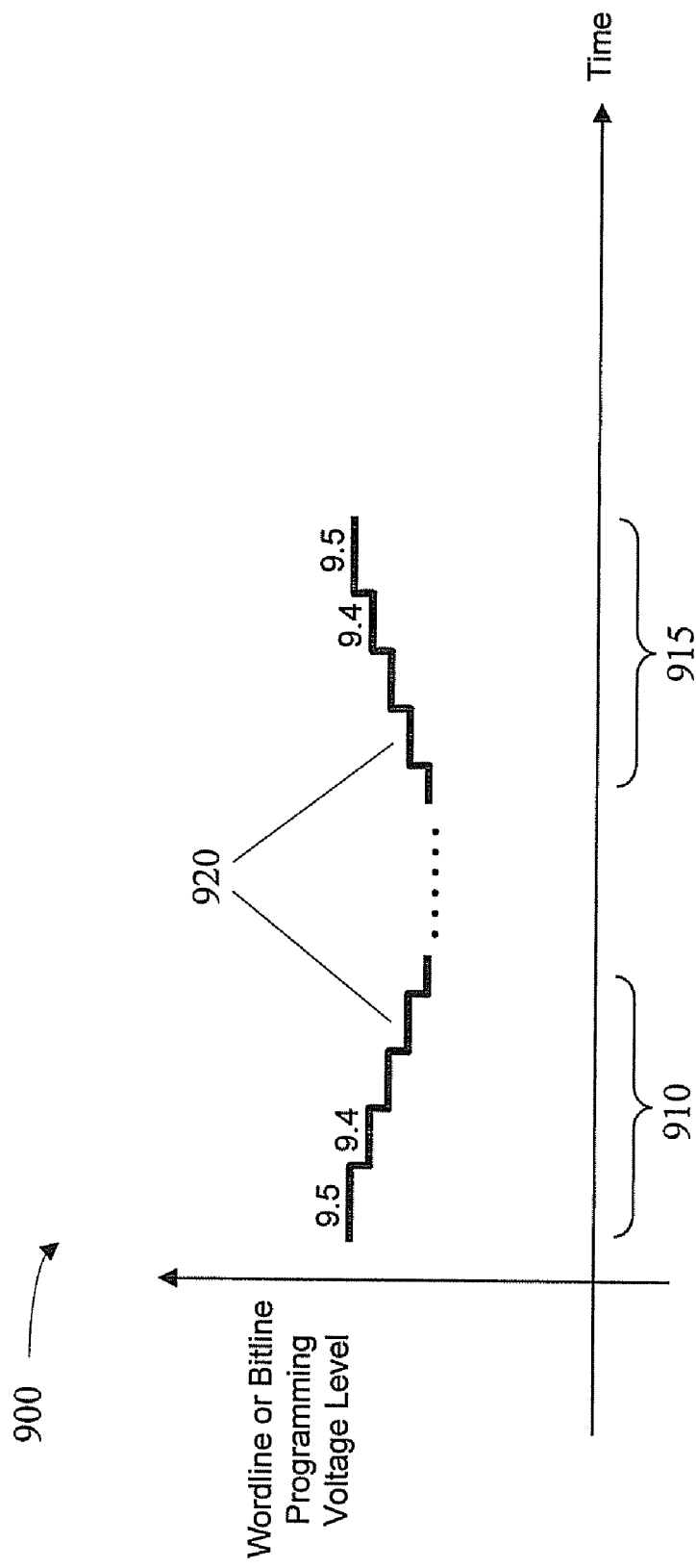
FIG. 9 illustrates exemplary compensated programming voltage data in accordance with one aspect of the specification.

FIG. 9 is a graph 900 illustrating exemplary compensated programming voltage data in accordance with one aspect of the specification. More specifically, graph 900 illustrates wordline and/or bitline programming voltage levels (e.g., generated by a high voltage pump 830) versus time for sequential programming operations on multiple cells in a memory array (e.g., memory array 860). In the exemplary programming operations illustrated by graph 900, addressed cells are programmed one wordline at a time, beginning at a first edge of the memory array and ending at an opposite edge of the memory array. It should be appreciated that this is merely one procedure by which a flash memory array can be programmed and that other procedures can also utilize one or more embodiments disclosed herein.

Broken line 920 illustrates adjustments made to the wordline and/or bitline voltages (e.g., by compensation logic 820), which in turn can be applied to a memory array (e.g., memory array 860, via x-decoder 840 and y-decoder 850) during sequential programming operations. Region 910 of graph 900 represents a time period in which programming of a memory array moves from a first edge of the memory array to the center of the memory array. As illustrated by broken line 920 over region 910, the wordline and/or bitline programming voltages can be periodically decreased over this time period to facilitate faster programming of memory cells near the first edge of the memory array and/or slower programming of memory cells near the center of the array. In one example, the voltage level represented by broken line 920 can be decreased for each wordline or group of wordlines between the first edge and the center of the memory array. In the non-limiting example illustrated by graph 900, a wordline and/or bitline programming voltage can start at about 9.5 volts and decrease by about 0.1 volts for each wordline or group of wordlines encountered over region 910.

Similarly, region 915 of graph 900 represents a time period in which programming of a memory array moves from the center of the memory array to an opposing edge of the memory array. As illustrated by broken line 920 over region 915, the wordline and/or bitline programming voltages can be periodically increased over this time to facilitate faster programming of memory cells near the opposing edge of the memory array and/or slower programming of memory cells near the center of the array. In the non-limiting example illustrated by graph 900, a wordline and/or bitline programming voltage can increase by about 0.1 volts for each wordline or group of wordlines encountered over region 915 until the opposing edge of the memory array is reached, at which time the programming voltage can again reach about 9.5 volts.

Figure 10:
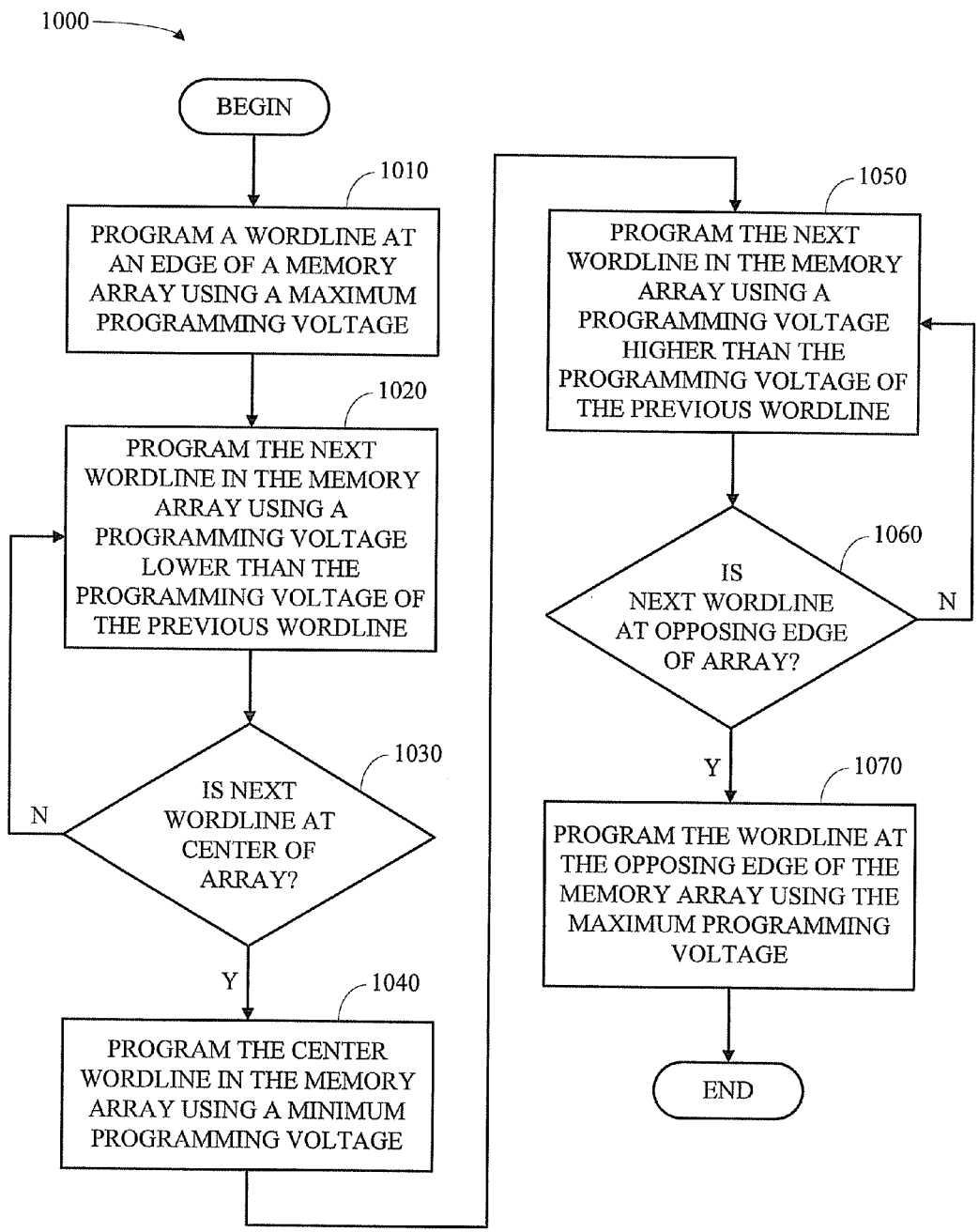
FIG. 10 illustrates a flow diagram of a methodology for programming a memory array.
Figure 11:
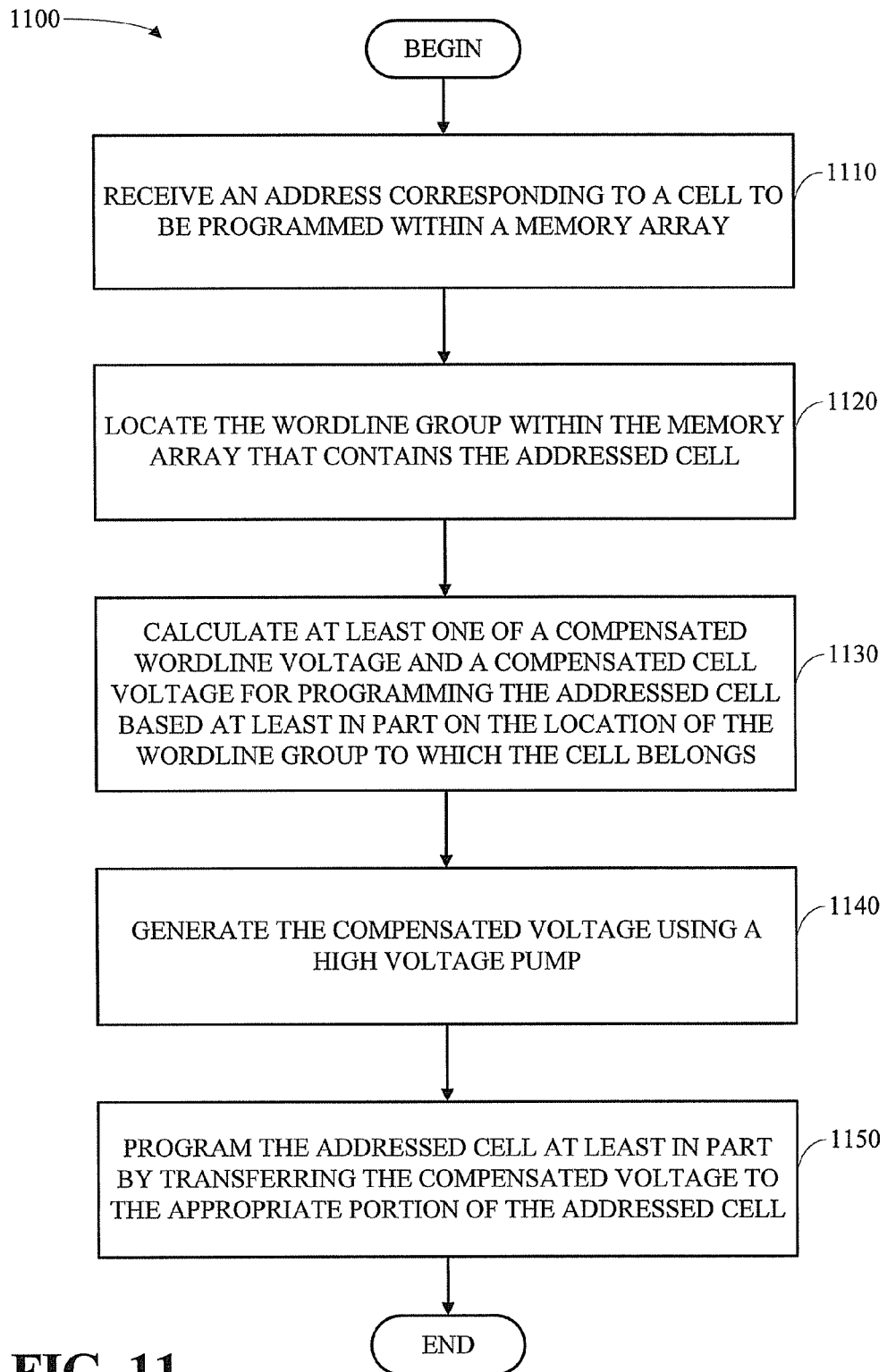
FIG. 11 illustrates a flow diagram of a methodology for programming a cell within a memory array.

Referring now to FIGS. 10 and 11, methodologies that may be implemented in accordance with one or more aspects of the specification are illustrated. While, for purposes of simplicity of explanation, the methodologies are shown and described as a series of blocks, it is to be understood and appreciated that the claimed subject matter is not limited by the order of the blocks, as some blocks may, in accordance with one or more embodiments, occur in different orders and/or concurrently with other blocks from that shown and described herein. Moreover, not all illustrated blocks may be required to implement the methodologies in accordance with one or more aspects of the specification.

FIG. 10 is a flow diagram 1000 of one possible methodology for programming a memory array (e.g. memory array 130) in accordance with one aspect of the specification. The methodology begins at act 1010, wherein a wordline at an edge of a memory array is programmed using a maximum programming voltage level. The maximum programming voltage used in methodology 1000 can be, for example, a predetermined voltage level. In accordance with one aspect, a wordline is programmed by programming individual memory cells that are connected to the wordline. Additionally, depending on the number and location of cells connected to the wordline to be programmed (e.g., as provided by an address sequencer 810), programming a wordline in a memory array may involve programming one cell, a plurality of cells, or no cells connected to the wordline. Furthermore, the programming voltage used to program the wordline in the methodology 1000 can be a wordline high voltage and/or a high voltage provided to the source and/or drain of individual cells within a wordline such as a bitline high voltage.

After completing act 1010, the methodology 1000 proceeds to act 1020, wherein the next wordline in the memory array is programmed using a programming voltage that is lower than the programming voltage that was used for the previous wordline. In one example, the lower programming voltage used in act 1020 can be determined by decreasing the programming voltage used for the previous wordline by a predetermined amount in a similar manner to the voltage levels illustrated by broken line 920 in graph 900. Further, in one specific, non-limiting example, the amount of programming voltage decrease between wordlines can be calculated by dividing the difference between the predetermined maximum programming voltage and a predetermined minimum programming voltage (e.g., as used in act 1040) by the number of wordlines in the memory array from an edge of the array to the center. After the relevant wordline is programmed in act 1020, the methodology 1000 proceeds to act 1030 where it is determined whether the next wordline is at the center of the memory array. If the next wordline is not at the center of the array, the methodology 1000 returns to act 1020 to program the next wordline. If the next wordline is at the center of the array, the methodology 1000 proceeds to act 1040, wherein the center wordline is programmed using a minimum programming voltage. In alternative, non-limiting examples, the minimum programming voltage can be predetermined or it can be reached by decreasing a predetermined maximum voltage level by a predetermined amount over each wordline up to and including the center wordline.

After programming the center wordline in act 1040, the methodology 1000 next programs the wordlines from the center of the array to an opposing edge of the array. Accordingly, the methodology 1000 proceeds to act 1050, wherein the next wordline in the array is programmed using a higher programming voltage than that used for the previous wordline. In one example, the amount by which the programming voltage is increased in act 1050 is substantially the same as the predetermined amount by which the programming voltage was decreased in act 1020. In this way, the programming voltage in act 1050 is increased by a predetermined amount in a similar manner to the voltage levels illustrated by broken line 920 over region 915 of graph 900. After the relevant wordline is programmed in act 1050, the methodology 1000 proceeds to act 1060 where it is determined whether the next wordline is located at an opposing edge of the array. If the next wordline is not at an opposing edge of the array, the mythology 1000 returns to act 1050 to program the next wordline. If the next wordline is at an opposite edge of the array, the methodology concludes at 1070, wherein the wordline at the opposing edge of the array is programmed using the maximum programming voltage that was used in act 1000.

FIG. 11 is a flow diagram of an exemplary methodology 1100 for programming a cell within a memory array. The methodology begins at act 1110, wherein an address (e.g., address 801) corresponding to a cell to be programmed within a memory array (e.g., memory array 860) is received. Next, at act 1120, the wordline group within the memory array that contains the addressed cell is located (e.g., from wordline groups 845). At act 1130, at least one of a compensated wordline voltage and a compensated cell voltage is calculated for programming the addressed cell (e.g., by compensation logic 820). The cell voltage can be, for example, a source voltage or a drain voltage for the addressed cell. Additionally, the calculation in act 1130 can be based at least in part on the location of the wordline group to which the addressed cell belongs. Next, the methodology proceeds to act 1140, wherein the compensated voltage(s) calculated in act 1130 are generated using a high voltage pump (e.g., high voltage pump 830). Finally, at act 1150, the addressed cell is programmed at least in part by transferring the compensated voltage(s) generated in act 1140 to the appropriate portion of the addressed cell (e.g., via an x-decoder 840 and/or a y-decoder 850).

Figure 12A:
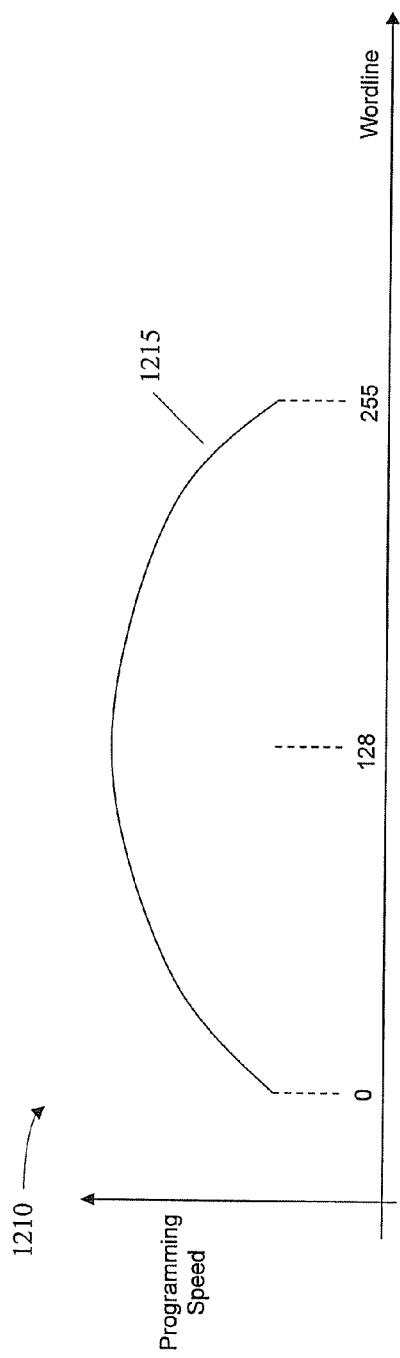
FIG. 12A illustrates exemplary programming speed data for a conventional flash memory device.

FIG. 12A is a graph 1210 that illustrates exemplary programming speed data for a conventional flash memory device. More particularly, graph 1210 illustrates the relative programming speed by which a conventional flash memory device can program the wordlines of a memory array within the flash memory device having 256 wordlines with indices 0 through 255. As illustrated by line 1215, conventional flash memory devices experience a significant amount of programming speed non-uniformity due to differences in the IR drop experienced by programming voltages at different parts of the memory array. Specifically, line 1215 illustrates that programming speed at the edges of the array near wordlines 0 and 255 is significantly slower than the programming speed at the center of the array near wordline 128. This can be the result of, for example, a high IR drop near the center of the array that slows and/or weakens erase operations near the center of the array and conversely speeds up programming operations near the center of the array. Additionally, the non-uniformity illustrated by line 1215 can be the result of a low IR drop near the edges of the array that speeds up and/or strengthens erase operations near the edges of the array and conversely slows programming operations near the edges of the array.

Figure 12B:
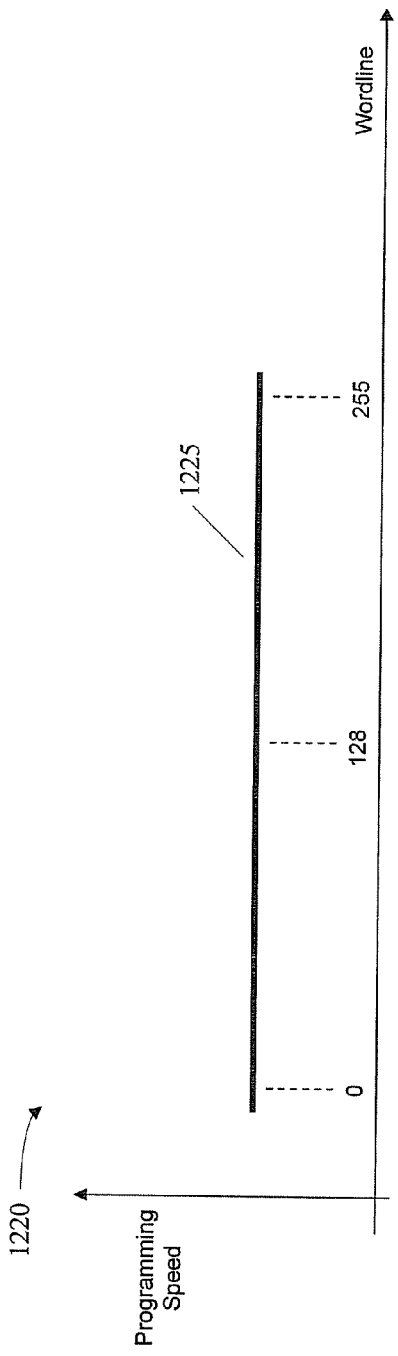
FIG. 12B illustrates exemplary programming speed data for a flash memory device with programming compensation in accordance with one aspect of the specification.

In contrast to FIG. 12A, FIG. 12B is a graph 1220 that illustrates exemplary programming speed data for a flash memory device with programming compensation in accordance with one aspect of the specification. Similar to graph 1210, graph 1220 illustrates the relative programming speed by which a flash memory device using programming compensation in accordance with one aspect of the specification can program the wordlines of a memory array within the flash memory device having 256 wordlines with indices 0 through 255. By using the programming compensation techniques disclosed in accordance with various aspects of the specification, it is illustrated by line 1225 that the programming speed non-uniformity experienced by conventional flash memory devices can be effectively removed. Further, as line 1225 illustrates, programming speed in a flash memory device with programming compensation in accordance with the specification can be uniform regardless of the location of a wordline in the memory array.

What has been described above includes examples of the disclosed information. It is, of course, not possible to describe every conceivable combination of components or methodologies for purposes of describing the disclosed information, but one of ordinary skill in the art may recognize that many further combinations and permutations of the disclosed information are possible. Accordingly, the disclosed information is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates performing a high voltage operation in a flash memory device, comprising:
    a memory array having a plurality of wordlines, each wordline coupled to a plurality of memory cells;
    a high voltage pump that generates at least one operation voltage for the high-voltage operation and transfers the at least one operation voltage to the memory array; and
    a compensation component that adjusts the voltage generated by the high voltage pump based as a function of distance between a location of a wordline in the memory array coupled to one or more memory cells on which the high voltage operation is to be performed and an edge of the memory array.

2. The system of claim 1, wherein the high voltage operation is a programming operation.

3. The system of claim 2, wherein the compensation component adjusts the at least one operation voltage upward if the wordline in the memory array coupled to one or more memory cells on which the programming operation is to be performed is located near an edge of the memory array, thereby increasing programming speed on the one or more memory cells.

4. The system of claim 2, wherein the compensation component adjusts the at least one operation voltage downward if the wordline in the memory array coupled to one or more memory cells on which the programming operation is to be performed is located near the center of the memory array, thereby decreasing programming speed on the one or more memory cells.

5. The system of claim 1, wherein the memory array includes an x-decoder for transferring a first operation voltage to a wordline in the memory array and a y-decoder for transferring a second operation voltage to a memory cell in each wordline in the memory array.

6. The system of claim 5, wherein the y-decoder transfers the second operation voltage to one of a source of a memory cell in each wordline in the memory array and a drain of a memory cell in each wordline in the memory array.

7. The system of claim 5, wherein the memory array further includes bitlines that connect a memory cell coupled to each wordline in the memory array and the y-decoder transfers a second operation voltage to a bitline in the memory array.

8. The system of claim 7, wherein the high voltage operation is performed on a plurality of memory cells that share a common wordline in the memory array by keeping the x-decoder stationary to provide the first operation voltage to the common wordline and switching the y-decoder to sequentially provide the second operation voltage to bitlines in the memory array that are connected to the plurality of memory cells.

9. The system of claim 1, wherein one or more adjacent wordlines in the memory array are divided into wordline groups and the compensation component adjusts the operation voltage generated by the high voltage pump based on the location of a wordline group in the memory array containing one or more memory cells on which the high voltage operation is performed.

10. The system of claim 1, further comprising an address sequencer that receives an address for each of the one or more memory cells on which the high voltage operation is performed.

11. A method of performing a high voltage operation in a flash memory device, comprising:
    receiving address information corresponding to a location of one or more memory cells in a memory array;
    calculating one or more compensated operation voltages based at least in part on the location of the one or more memory cells in the memory array in relation to one or more edges of the memory array;
    generating the one or more compensated operation voltages; and
    transferring the one or more compensated operation voltages to the one or more memory cells in the memory array.

12. The method of claim 11, wherein the high voltage operation is a programming operation.

13. The method of claim 12, wherein the calculating includes determining a wordline in the memory array on which each of the one or more memory cells is respectively located.

14. The method of claim 13, wherein the calculating further includes at least one of increasing a standard programming voltage to be transferred to a memory cell located on a wordline near an edge of the memory array, thereby increasing programming speed on the memory cell; and decreasing a standard programming voltage to be transferred to a memory cell located on a wordline near the center of the memory array, thereby decreasing programming speed on the memory cell.

15. The method of claim 12, wherein the calculating further includes grouping one or more adjacent wordlines into wordline groups and determining the wordline group in which each of the one or more memory cells is respectively located.

16. The method of claim 15, wherein the calculating further includes:
    assigning two or more wordline groups located at opposing edges of the memory array a predetermined maximum programming voltage;
    assigning one or more wordline groups located at the center of the memory array a predetermined minimum programming voltage; and
    assigning each wordline group between the edges and the center of the memory array an intermediate programming voltage between the maximum programming voltage and the minimum programming voltage such that a first intermediate programming voltage corresponding to a first wordline group is lower than a second intermediate programming voltage corresponding to a second wordline group that is located closer to an edge of the array than the first wordline group.

17. The method of claim 11, wherein the compensated operation voltages include at least one of a wordline voltage, a source voltage, and a drain voltage.

18. A system for performing a high voltage operation in a flash memory device, comprising:
   means for receiving address information corresponding to a location of one or more memory cells in a memory array;
   means for generating a high voltage for the high voltage operation;
   means for compensating the high voltage based at least in part on a distance from the one or more memory cells in the memory array to a center wordline of the memory array; and
   means for transferring the high voltage to the one or more cells in the memory array.

19. The system of claim 18, wherein the high voltage operation is a programming operation.

20. The system of claim 18, wherein the high voltage is one of a wordline voltage, a source voltage, and a drain voltage.

* * * * *